United States Patent
Kato et al.

(10) Patent No.: US 9,096,032 B2
(45) Date of Patent: Aug. 4, 2015

(54) WAFER PROCESSING LAMINATE, WAFER PROCESSING MEMBER, TEMPORARY BONDING ARRANGEMENT, AND THIN WAFER MANUFACTURING METHOD

(71) Applicant: SHIN-ETSU CHEMICAL CO., LTD., Tokyo (JP)

(72) Inventors: Hideto Kato, Annaka (JP); Michihiro Sugo, Annaka (JP); Shohei Tagami, Annaka (JP); Hiroyuki Yasuda, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 284 days.

(21) Appl. No.: 13/868,503

(22) Filed: Apr. 23, 2013

(65) Prior Publication Data

US 2013/0280886 A1    Oct. 24, 2013

(30) Foreign Application Priority Data

Apr. 24, 2012    (JP) ................. 2012-098734

(51) Int. Cl.

| H01L 21/00 | (2006.01) |
| H01L 23/48 | (2006.01) |
| B32B 7/06 | (2006.01) |
| H01L 21/02 | (2006.01) |
| B32B 7/12 | (2006.01) |
| H01L 21/762 | (2006.01) |
| H01L 23/00 | (2006.01) |
| H01L 21/683 | (2006.01) |
| C09J 7/02 | (2006.01) |

(52) U.S. Cl.
CPC ... *B32B 7/06* (2013.01); *B32B 7/12* (2013.01); *C09J 7/0296* (2013.01); *H01L 21/02013* (2013.01); *H01L 21/6835* (2013.01); *H01L 21/6836* (2013.01); *H01L 21/76251* (2013.01); *H01L 24/83* (2013.01); *C09J 2203/326* (2013.01); *H01L 2221/6834* (2013.01); *H01L 2221/68327* (2013.01); *Y10T 428/24612* (2015.01)

(58) Field of Classification Search
CPC ............. H01L 24/83; H01L 21/76251; H01L 21/6836; H01L 21/02013; H01L 21/6835; H01L 2221/6834; B32B 7/06; B32B 7/12; C09J 7/0296; Y10T 428/24612
See application file for complete search history.

(56) References Cited

U.S. PATENT DOCUMENTS

| 7,534,498 | B2 | 5/2009 | Noda et al. | |
| 7,541,264 | B2 | 6/2009 | Gardner et al. | |
| 2010/0279468 | A1* | 11/2010 | Ootake et al. | 438/113 |
| 2011/0121435 | A1* | 5/2011 | Mitsukura et al. | 257/632 |

(Continued)

FOREIGN PATENT DOCUMENTS

| JP | 2004-064040 A | 2/2004 |
| JP | 2006-328104 A | 12/2006 |
| WO | 2004/006296 A2 | 1/2004 |

*Primary Examiner* — Alonzo Chambliss
(74) *Attorney, Agent, or Firm* — Westerman, Hattori, Daniels & Adrian, LLP

(57) ABSTRACT

A wafer processing laminate is provided comprising a support (3), a temporary adhesive layer (2), and a wafer (1). The temporary adhesive layer (2) has a trilayer structure consisting of a first temporary bond layer (A) of thermoplastic siloxane bond-free polymer, a second temporary bond layer (B) of thermoplastic siloxane polymer, and a third temporary bond layer (C) of thermosetting modified siloxane polymer. In a peripheral region, the second layer (B) is removed so that the first layer (A) is in close contact with the third layer (C).

23 Claims, 1 Drawing Sheet

(56) References Cited

U.S. PATENT DOCUMENTS

| | | | |
|---|---|---|---|
| 2013/0108866 A1* | 5/2013 | Kato et al. | 428/354 |
| 2013/0220687 A1* | 8/2013 | Tagami et al. | 174/259 |
| 2014/0106137 A1* | 4/2014 | Kondo et al. | 428/195.1 |
| 2014/0154868 A1* | 6/2014 | Sugo et al. | 438/458 |

* cited by examiner

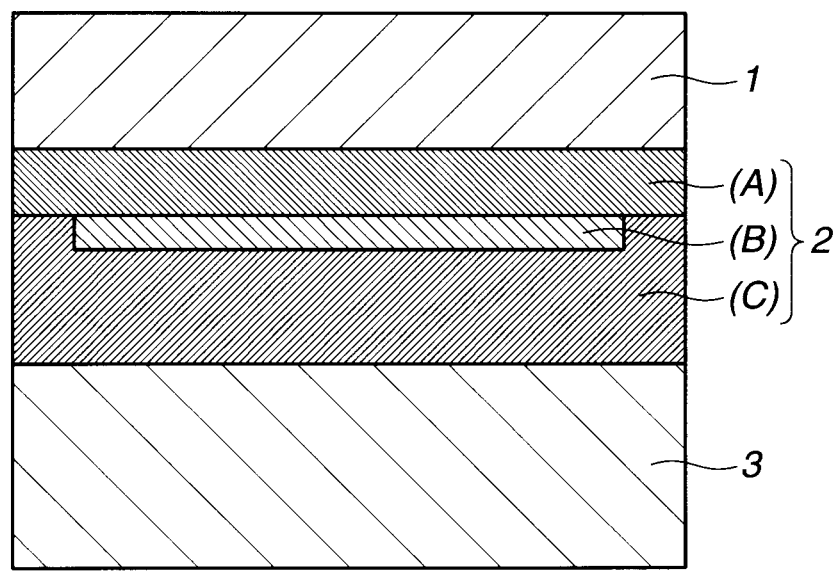

WAFER PROCESSING LAMINATE, WAFER PROCESSING MEMBER, TEMPORARY BONDING ARRANGEMENT, AND THIN WAFER MANUFACTURING METHOD

CROSS-REFERENCE TO RELATED APPLICATION

This non-provisional application claims priority under 35 U.S.C. §119(a) on Patent Application No. 2012-098734 filed in Japan on Apr. 24, 2012, the entire contents of which are hereby incorporated by reference.

TECHNICAL FIELD

This invention relates to a wafer processing laminate, wafer processing member and temporary bonding arrangement allowing for processing the wafer, and a method for manufacturing a thin wafer.

BACKGROUND ART

Three-dimensional semiconductor packages become essential for a higher density and capacity. The 3D semiconductor packaging technology is by thinning semiconductor chips, and stacking them in multilayer structure while providing through-silicon via (TSV) interconnects. Fabrication of such packages requires the steps of thinning a substrate having a semiconductor circuit formed therein by grinding its non-circuit forming surface or back surface, and forming TSV and electrodes on the back surface. In the prior art, prior to the step of grinding the back surface of a silicon substrate, a protective tape is attached to the surface of the substrate opposite to the surface to be ground for preventing the wafer from breakage during the grinding step. Since the protective tape is based on an organic resin film, it is flexible, but has insufficient strength and heat resistance to withstand the TSV forming step and the step of forming interconnects on the back surface.

It is then proposed to bond a semiconductor substrate to a support of silicon or glass, for example, via an adhesive layer. The resulting system is sufficient to withstand the steps of grinding the back surface and forming TSV and electrodes on the back surface. The adhesive layer for bonding the substrate to the support is critical for this system. The adhesive layer must bond the substrate to the support without leaving gaps, be durable enough to withstand the subsequent steps, and eventually allow the thin wafer to be readily released from the support. The adhesive layer is referred herein to as "temporary adhesive layer" since it is finally removed.

With regard to temporary adhesive layers and removal thereof, Patent Document 1 discloses a layer of an adhesive composition containing a light absorbing agent. The adhesive layer is irradiated with high intensity light for decomposing the adhesive composition so that the layer may be removed. Patent Document 2 discloses a layer of an adhesive composition comprising a heat melting hydrocarbon compound, wherein the layer can be bonded and released in the heat molten condition. The former technology requires an expensive tool such as laser, a particular substrate (typically glass substrate) that is transmissive to laser light as the support, and a longer time of treatment per substrate. The latter technology is simple because of control only by heat, but is applicable to a limited range because of instability at high temperatures in excess of 200° C. These temporary adhesive layers are not adequate to form a layer of uniform thickness on a heavily stepped substrate and to provide a complete bond to the support.

Patent Document 3 discloses the use of a silicone pressure-sensitive adhesive composition as the temporary adhesive layer. A substrate is bonded to a support with an addition reaction curable silicone adhesive composition. On removal, the assembly is immersed in an etching solution capable of dissolving or decomposing the silicone resin, whereby the substrate is separated from the support. This method takes a very long time for removal and is applicable to the commercial manufacture process with difficulty.

CITATION LIST

Patent Document 1: JP-A 2004-64040 (U.S. Pat. No. 7,534,498, EP 1550156)
Patent Document 2: JP-A 2006-328104
Patent Document 3: U.S. Pat. No. 7,541,264

SUMMARY OF INVENTION

An object of the invention is to provide a wafer processing laminate, wafer processing member or temporary bonding arrangement, which facilitates to establish a temporary bond between a wafer and a support, enables to form an adhesive layer of uniform thickness even on a heavily stepped substrate, is compatible with the TSV forming and back surface interconnect forming steps, allows for easy removal, and offers high productivity. Another object is to provide a method for manufacturing a thin wafer using the laminate, member or arrangement.

The inventors have found that a thin wafer having a TSV structure or bump interconnect structure can be easily manufactured when a temporary bond arrangement of tri-layer system consisting of (A) a first temporary bond layer of thermoplastic siloxane bond-free polymer, (B) a second temporary bond layer of thermoplastic organopolysiloxane having a high degree of polymerization, and (C) a third temporary bond layer of thermosetting polymer comprising a modified siloxane polymer based layer is used to establish a bond between a wafer and a support, with the proviso that said temporary bond arrangement is constructed by forming layers (A), (B) and (C) on the wafer in the described order, and removing a peripheral region of intermediate layer (B) so that peripheral regions of layers (A) and (C) are in close contact.

In a first aspect, the invention provides a wafer processing laminate comprising a support, a temporary adhesive layer on the support, and a wafer laid contiguous to the temporary adhesive layer, the wafer having a circuit-forming front surface and a back surface to be processed. The temporary adhesive layer is a composite temporary adhesive layer having a trilayer structure consisting of a first temporary bond layer (A) of thermoplastic siloxane bond-free polymer which is releasably bonded to the front surface of the wafer, a second temporary bond layer (B) of thermoplastic siloxane polymer which is laid contiguous to a central region of the first temporary bond layer excluding a peripheral region, and a third temporary bond layer (C) of thermosetting modified siloxane polymer which is laid contiguous to the support, wherein in the peripheral region where the second temporary bond layer (B) is removed, a peripheral portion of the first temporary bond layer (A) is in close contact with a peripheral portion of the third temporary bond layer (C).

In one preferred embodiment, a ratio of the removal of the peripheral region of the secondary temporary bond layer (B) to the radius of the wafer is 0.1 to 20%. More specifically, the peripheral region where the second temporary bond layer (B) is removed is a region extending between the outermost periphery of the wafer and a position spaced apart 0.5 to 10 mm radially inward from the outermost periphery of the wafer.

In one preferred embodiment, the second temporary bond layer (B) of thermoplastic siloxane polymer has a thickness of 0.1 to 10 μm, and the third temporary bond layer (C) of thermosetting modified siloxane polymer has a thickness of 15 to 150 μm.

In one preferred embodiment, the first temporary bond layer (A) of thermoplastic siloxane bond-free polymer comprises a thermoplastic elastomer, typically a hydrogenated polystyrene base elastomer.

In one preferred embodiment, the second temporary bond layer (B) comprise a non-reactive organopolysiloxane consisting of 99.000 to 99.999 mol % of difunctional siloxane units of $R^{11}R^{12}SiO_{2/2}$, 1.000 to 0.001 mol % of monofunctional siloxane units of $R^{13}R^{14}R^{15}SiO_{1/2}$, and 0.000 to 0.500 mol % of trifunctional siloxane units of $R^{16}SiO_{3/2}$, wherein $R^{11}$, $R^{12}$, $R^{13}$, $R^{14}$, $R^{15}$, and $R^{16}$ are each independently a substituted or unsubstituted monovalent hydrocarbon group, having a weight average molecular weight of 200,000 to 1,000,000, and containing up to 0.5% by weight of a low molecular fraction having a molecular weight of up to 740.

In one preferred embodiment, the third temporary bond layer (C) of thermosetting modified siloxane polymer is a cured layer of a thermosetting resin composition comprising a siloxane bond-containing polymer and a crosslinker.

In one preferred embodiment, the thermosetting resin composition comprises 100 parts by weight of a siloxane bond-containing polymer comprising recurring units of the general formula (1) and having a weight average molecular weight of 3,000 to 500,000, and 0.1 to 50 parts by weight of a crosslinker which is selected from the group consisting of an amino condensate modified with formaldehyde or formaldehyde-alcohol, a melamine resin, a urea resin, a phenol compound having on average at least two methylol or alkoxymethylol groups per molecule, and an epoxy compound having on average at least two epoxy groups per molecule,

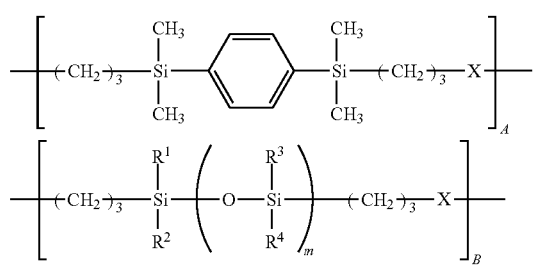

(1)

wherein $R^1$ to $R^4$ are each independently a monovalent hydrocarbon group of 1 to 8 carbon atoms, m is an integer of 1 to 100, B is a positive number, A is 0 or a positive number, and X is a divalent organic group having the general formula (2):

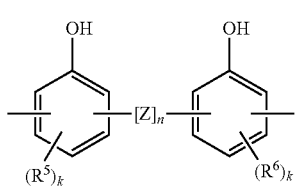

(2)

wherein Z is a divalent organic group selected from the following:

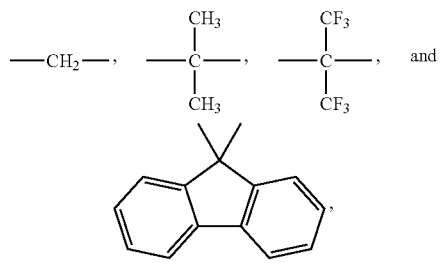

n is 0 or 1, $R^5$ and $R^6$ are each independently an alkyl or alkoxy group of 1 to 4 carbon atoms, and k is 0, 1 or 2.

In another preferred embodiment, the thermosetting resin composition comprises 100 parts by weight of a siloxane bond-containing polymer comprising recurring units of the general formula (3) and having a weight average molecular weight of 3,000 to 500,000, and 0.1 to 50 parts by weight of a crosslinker which is selected from the group consisting of a phenol compound having on average at least two phenol groups per molecule and an epoxy compound having on average at least two epoxy groups per molecule,

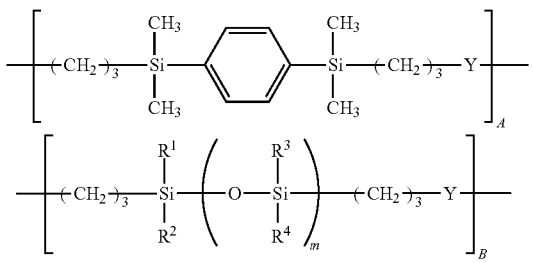

(3)

wherein $R^1$ to $R^4$ are each independently a monovalent hydrocarbon group of 1 to 8 carbon atoms, m is an integer of 1 to 100, B is a positive number, A is 0 or a positive number, and Y is a divalent organic group having the general formula (4):

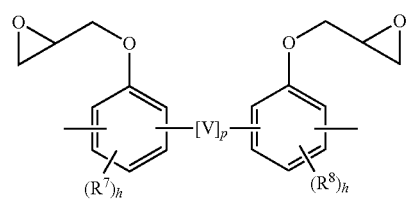

(4)

wherein V is a divalent organic group selected from the following:

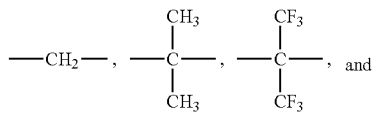
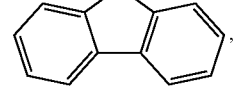

p is 0 or 1, $R^7$ and $R^8$ are each independently an alkyl or alkoxy group of 1 to 4 carbon atoms, and h is 0, 1 or 2.

In a second aspect, the invention provides a wafer processing member comprising a support and a temporary adhesive layer on the support, wherein a wafer having a circuit-forming front surface and a back surface to be processed will be temporarily bonded to the temporary adhesive layer. The temporary adhesive layer is a composite temporary adhesive layer having a trilayer structure consisting of a first temporary bond layer (A) of thermoplastic siloxane bond-free polymer which can be releasably bonded to the front surface of the wafer, a second temporary bond layer (B) of thermoplastic siloxane polymer which is laid contiguous to a central region of the first temporary bond layer excluding a peripheral region, and a third temporary bond layer (C) of thermosetting modified siloxane polymer which is laid contiguous to the support, wherein in the peripheral region where the second temporary bond layer (B) is removed, a peripheral portion of the first temporary bond layer (A) is in close contact with a peripheral portion of the third temporary bond layer (C).

In preferred embodiments, the first temporary bond layer (A) of thermoplastic siloxane bond-free polymer comprises a polymer layer of a thermoplastic elastomer, typically a hydrogenated polystyrene base elastomer; the second temporary bond layer (B) comprise a non-reactive organopolysiloxane as defined above; the third temporary bond layer (C) is a cured layer of a composition comprising a siloxane bond-containing polymer of formula (1) and a crosslinker, or a composition comprising a siloxane bond-containing polymer of formula (3) and a crosslinker, as defined above.

In a third aspect, the invention provides an arrangement for temporarily bonding a wafer to a support for wafer processing, the wafer having a circuit-forming front surface and a back surface to be processed. The temporary bonding arrangement is a composite temporary adhesive layer having a trilayer structure consisting of a first temporary bond layer (A) of thermoplastic siloxane bond-free polymer which can be releasably bonded to the front surface of the wafer, a second temporary bond layer (B) of thermoplastic siloxane polymer which is laid contiguous to a central region of the first temporary bond layer excluding a peripheral region, and a third temporary bond layer (C) of thermosetting modified siloxane polymer which can be laid contiguous to the support, wherein in the peripheral region where the second temporary bond layer (B) is removed, a peripheral portion of the first temporary bond layer (A) is in close contact with a peripheral portion of the third temporary bond layer (C).

In preferred embodiments, the first temporary bond layer (A) of thermoplastic siloxane bond-free polymer comprises a polymer layer of a thermoplastic elastomer, typically a hydrogenated polystyrene base elastomer; the second temporary bond layer (B) comprise a non-reactive organopolysiloxane as defined above; the third temporary bond layer (C) is a cured layer of a composition comprising a siloxane bond-containing polymer of formula (1) and a crosslinker, or a composition comprising a siloxane bond-containing polymer of formula (3) and a crosslinker, as defined above.

In a fourth aspect, the invention provides a method for manufacturing a wafer processing laminate, the wafer processing laminate comprising a support, a temporary adhesive layer on the support, and a wafer laid contiguous to the temporary adhesive layer, the wafer having a circuit-forming front surface and a back surface to be processed, the method comprising the steps of:

preparing a wafer component by forming a first temporary bond layer (A) of thermoplastic siloxane bond-free polymer on a wafer, the wafer component having the first temporary bond layer (A) being releasably bonded to the front surface of the wafer, preparing a support component by forming a third temporary bond layer (C) of thermosetting modified siloxane polymer on a support, forming a second temporary bond layer (B) of thermoplastic siloxane polymer on the third temporary bond layer (C), and removing a portion of the second temporary bond layer (B) which corresponds to a peripheral region of the wafer, using a solvent, and laminating together the wafer component and the support component.

In a fifth aspect, the invention provides a method for manufacturing a thin wafer by releasably bonding a wafer to a support via a bonding arrangement comprising a combination of a thermoplastic siloxane bond-free polymer layer (A), a thermoplastic siloxane polymer layer (B), and a thermosetting modified siloxane polymer layer (C), the wafer having a circuit-forming front surface and a non-circuit-forming back surface, with the circuit-forming surface facing the support, the method comprising the steps of:

(a) forming polymer layer (C) on the support, forming polymer layer (B) on polymer layer (C), removing only a region of polymer layer (B) which corresponds to a peripheral region of the wafer, and forming polymer layer (A) on the wafer, (b) laminating together the support having polymer layers (C) and (B) formed thereon and the wafer having polymer layer (A) formed thereon in vacuum, (c) heat curing polymer layer (C), (d) grinding the non-circuit-forming surface of the wafer bonded to the support, (e) processing the non-circuit-forming surface of the wafer, (f) releasing the processed wafer from the support, and (g) optionally removing any bond layer from the circuit-forming surface of the wafer.

In a sixth aspect, the invention provides a method for manufacturing a thin wafer, comprising the steps of releasably bonding a wafer to a support via a bonding arrangement to form a laminate, the bonding arrangement comprising a combination of a thermoplastic siloxane bond-free polymer layer (A), a thermoplastic siloxane polymer layer (B), and a thermosetting modified siloxane polymer layer (C), the wafer having a circuit-forming front surface and a non-circuit-forming back surface, with the circuit-forming surface facing the support, processing the wafer, and releasing the processed wafer from the support, the step (f) of releasing the processed wafer from the support including (f-1) attaching a dicing tape to the processed surface of the wafer, (f-2) vacuum chucking the dicing tape-attached surface to a chuck surface, (f-3) releasing the support from the processed wafer by peel-off while keeping the chuck surface at a temperature in the range of 10 to 100° C., and (f-4) removing any bond layer from the circuit-forming surface of the wafer.

ADVANTAGEOUS EFFECTS OF INVENTION

The temporary adhesive layer is applicable to a wide range of semiconductor film forming process because a thermosetting siloxane-modified resin is used as a supporting layer for wafer bonding, the resin having the advantages of no thermal decomposition, no flow at elevated temperature, and heat resistance. An adhesive layer of uniform thickness can be formed even on a stepped wafer. By virtue of thickness uniformity of the adhesive layer, a uniform thin wafer of up to 50 μm can be readily manufactured. After a thin wafer is manufactured, the wafer can be readily removed from the support at room temperature. Another advantage is ease of handling of a thin wafer despite its fragility.

BRIEF DESCRIPTION OF DRAWING

FIG. 1 is a cross-sectional view of a wafer processing laminate in one embodiment of the invention.

DESCRIPTION OF PREFERRED EMBODIMENT

In one embodiment of the invention, a laminate for wafer processing is shown in FIG. 1 as comprising a wafer 1 to be processed, a support 3 for carrying the wafer 1 during its processing, and a temporary adhesive layer (or temporary bonding arrangement) 2 intervening between the wafer 1 and the support 3. The wafer 1 has a circuit-forming front surface and a back surface to be processed. The temporary bonding arrangement 2 has a trilayer structure consisting of (A) a first temporary bond layer of thermoplastic organopolysiloxane-free polymer, (B) a second temporary bond layer of thermoplastic organopolysiloxane polymer, and (C) a third temporary bond layer of thermosetting modified siloxane polymer. The first temporary bond layer (A) is releasably bonded to the front surface of the wafer 1. The third temporary bond layer (C) is releasably bonded to the support 3.

Another embodiment is a member for wafer processing, comprising the support 3, the thermosetting modified-siloxane polymer layer (C) on support 3, the thermoplastic siloxane polymer layer (B) on layer (C), and the thermoplastic siloxane-free polymer layer (A) on layer (B). A further embodiment is a temporary bonding arrangement for wafer processing which consists of layers (A), (B), and (C).

In these embodiments, only a peripheral region of the thermoplastic siloxane polymer layer (B) is removed. In the peripheral region where the second temporary bond layer (B) of thermoplastic siloxane polymer is removed, a peripheral portion of the first temporary bond layer (A) of thermoplastic organopolysiloxane-free polymer is in direct or close contact with a peripheral portion of the third temporary bond layer (C) of thermosetting modified-siloxane polymer.

Namely, the invention provides a wafer processing laminate comprising a support, a temporary adhesive layer on the support, and a wafer on the layer, the wafer having a circuit-forming front surface and a back surface to be processed. The temporary adhesive layer (or temporary bonding arrangement) has a three-layer structure consisting of a third temporary bond layer (C) of thermosetting modified-siloxane polymer formed contiguous to the support, a second temporary bond layer (B) of thermoplastic siloxane polymer formed contiguous to the third layer (C), in which a peripheral region of the resin layer is removed by an edge bead rinse (EBR) or similar method using a suitable solvent, and a first temporary bond layer (A) of thermoplastic siloxane bond-free polymer which is releasably bonded to the surface of the wafer and includes a central region disposed contiguous to the second temporary bond layer (B).

Another embodiment is a wafer processing member comprising a support and a temporary adhesive layer on the support. A wafer having a circuit-forming front surface and a back surface to be processed will be temporarily bonded to the temporary adhesive layer. The temporary adhesive layer comprises, in combination, a third temporary bond layer (C) of thermosetting modified-siloxane polymer which is releasably bonded to the support, a second temporary bond layer (B) of thermoplastic siloxane polymer, and a first temporary bond layer (A) comprising a layer of thermoplastic siloxane bond-free polymer which is laid on the second layer and releasably bondable to the surface of the wafer.

A further embodiment is an arrangement for temporarily bonding a wafer to a support for wafer processing, the wafer having a circuit-forming front surface and a back surface to be processed. The temporary bonding arrangement has a trilayer structure consisting of a first temporary bond layer (A) of thermoplastic siloxane bond-free polymer which can be releasably bonded to the front surface of the wafer, a second temporary bond layer (B) of thermoplastic siloxane polymer which is laid on the first temporary bond layer, and a third temporary bond layer (C) of thermosetting modified siloxane polymer which is laid on the second temporary bond layer (B). In these embodiments, only a peripheral region of the second layer (B) is removed. In the peripheral region where the second layer (B) is removed, a peripheral portion of the first layer (A) is in direct or close contact with a peripheral portion of the third layer (C).

Temporary Adhesive Layer

First Temporary Bond Layer (A) of Thermoplastic Organopolysiloxane-Free Polymer

The first temporary bond layer (A) is formed of a thermoplastic siloxane bond-free polymer because a layer of a siloxane bond-containing polymer has a possibility of intermixing with overlay layer (B). Although the thermoplastic siloxane bond-free polymer is not particularly limited, a thermoplastic elastomer resin capable of spin coating is advantageously used to form layer (A) particularly when application to stepped silicon wafers is considered. Especially a hydrogenated polystyrene base elastomer is preferred for heat resistance. Examples of the hydrogenated polystyrene base elastomer include copolymers of styrene with olefins such as ethylene, propylene and butylene. A typical elastomer is commercially available as Septon® from Kuraray Co., Ltd.

Since the thermoplastic siloxane bond-free polymer is soluble in a solvent, its solution may be applied to wafers such as semiconductor substrates, typically silicon wafers by a suitable coating technique such as spin coating or spray coating. Suitable solvents include hydrocarbon solvents such as isooctane, nonane, p-menthane, pinene, and isooctane. Inter alia, nonane, p-menthane, and isooctane are preferred for efficient coating.

Although the coating thickness is not particularly limited, a resin coating is desirably formed so as to accommodate steps on the substrate. Preferably the polymer is coated to a thickness of 0.5 to 50 μm.

To the thermoplastic siloxane bond-free polymer, an antioxidant for improving heat resistance and a surfactant for facilitating coating may be added. A typical antioxidant is di-t-butyl phenol. Suitable surfactants include fluorosilicone surfactants, for example, X-70-1102 by Shin-Etsu Chemical Co., Ltd.

Second Temporary Bond Layer (B) of Thermoplastic Organopolysiloxane Polymer

The second temporary bond layer (B) is of thermoplastic organopolysiloxane. Specifically, the temporary bond layer (B) comprises a non-reactive organopolysiloxane consisting of 99.000 to 99.999 mol %, preferably 99.500 to 99.999 mol % of siloxane units of $R^{11}R^{12}SiO_{2/2}$ which are known as difunctional or D units, 1.000 to 0.001 mol %, preferably 0.500 to 0.001 mol % of siloxane units of $R^{13}R^{14}R^{15}SiO_{1/2}$, which are known as monofunctional or M units, and 0.000 to 0.500 mol %, preferably 0.000 to 0.100 mol % of siloxane units of $R^{16}SiO_{3/2}$, which are known as trifunctional or T units, having a weight average molecular weight of 200,000 to 1,000,000, and containing up to 0.5% by weight of a low molecular fraction having a molecular weight of up to 740.

In the formulae, the organic substituent groups $R^{11}$, $R^{12}$, $R^{13}$, $R^{14}$, $R^{15}$, and $R^{16}$, which may be the same or different, are substituted or unsubstituted monovalent hydrocarbon groups of 1 to 10 carbon atoms, for example, alkyl groups such as methyl, ethyl, n-propyl, isopropyl, n-butyl, t-butyl, n-pentyl, cyclopentyl, and n-hexyl, cycloalkyl groups such as cyclohexyl, aryl groups such as phenyl and tolyl, and substituted forms of the foregoing in which some or all hydrogen atoms are substituted by halogen atoms. Inter alia, methyl and phenyl are preferred.

The organopolysiloxane should have a weight average molecular weight (Mw) of at least 200,000, preferably at least 350,000, and up to 1,000,000, preferably up to 800,000. It is noted that Mw is measured by gel permeation chromatography (GPC) versus polystyrene standards. The content of a low molecular fraction having a molecular weight of up to 740 is up to 0.5% by weight, preferably up to 0.1% by weight. If Mw of the organopolysiloxane is less than 200,000, the laminate may not withstand the grinding step for thinning of a wafer. If Mw exceeds 1,000,000, the polymer may not be washed away in the cleaning step subsequent to the relevant process. If the content of a low molecular fraction having a molecular weight of up to 740 exceeds 0.5% by weight, the polymer may have insufficient heat resistance against heat treatment during TSV formation or heat treatment of bump electrodes on wafer back surface.

D units account for 99.000 to 99.999 mol % of the resin. If the content of D units is less than 99.000 mol %, the resin may not withstand the grinding step for thinning of a wafer. If the content of D units exceeds 99.999 mol %, separation from the layer (A) after the completion of the process may be inhibited.

M units are added to cap the active group at the end of a resin composed mainly of D units and used for adjusting the molecular weight thereof.

The thermoplastic organopolysiloxane layer (B) may be formed on an uncured thermosetting polymer layer (C) on a support (3) by applying a solution of organopolysiloxane by a suitable coating technique such as spin coating or roll coating. When layer (B) is formed on third temporary bond layer (C) by a coating technique such as spin coating, a solution of the resin is preferably prepared prior to coating. To this end, hydrocarbon solvents such as pentane, hexane, cyclohexane, isooctane, nonane, decane, p-menthane, pinene, isododecane, and limonene are preferably used. Any well-known antioxidants may be added to the thermoplastic organopolysiloxane solution for enhancing heat resistance. Besides, a filler such as silica may be added to the thermoplastic organopolysiloxane for enhancing heat resistance. Specifically up to 50 parts by weight of the filler may be added to 100 parts by weight of the organopolysiloxane.

The layer (B) is formed to a thickness in the range of 0.1 to 10 μm. If the layer (B) is less than 0.1 μm, it may fail to cover the entire area of thermosetting modified siloxane polymer layer (C). If the layer (B) is more than 10 μm, it may not withstand the grinding step in the manufacture of a thin wafer.

After layer (B) is formed on layer (C), only a region of layer (B) that extends between the outermost periphery of the wafer and a position spaced apart 0.5 to 10 mm radially inward from the outermost periphery of the wafer is removed. The purpose of removing this region of layer (B) is to establish in this wafer peripheral region a structure that thermosetting modified siloxane polymer layer (C) is in close contact with thermoplastic organosiloxane-free polymer layer (A) without intervening layer (B). The junction between layers (A) and (C) in the wafer peripheral region ensures a stable bond between the wafer and the support during various steps of the process. The method of removing the wafer peripheral region of layer (B) is not particularly limited, a method of stripping a resin coating only at the wafer edge by dropwise solvent application such as edge bead rinse (EBR) or edge rinse (ER) method may be used to strip or remove an annular region of layer (B) extending 0.5 to 10 mm radially inward from the wafer outermost periphery. After local removal of layer (B), the solvent is preferably evaporated off by heating at 100 to 200° C.

The solvent used herein is a hydrocarbon solvent capable of dissolving layer (B). Although the hydrocarbon solvent is not particularly limited, preference is given to nonane, p-menthane, pinene, isododecane and limonene for solubility and volatility.

A ratio of the removal of the peripheral region of layer (B) to the radius of the wafer is preferably 0.1 to 20%, and more preferably 0.2 to 15%. More specifically, the stripped region of layer (B) is adjusted to any position spaced 0.5 to 10 mm apart from the wafer outermost periphery, depending on a particular application. If the resin stripped region is narrower than 0.5 mm, it is difficult to achieve a direct junction between layers (A) and (C). If the resin stripped region is wider than 10 mm, the junction between layers (A) and (C) is too strong during the final wafer release step and can cause failure of the desired thin wafer.

Third Temporary Bond Layer (C) of Thermosetting Modified Siloxane Polymer

The third temporary bond layer (C) is of thermosetting modified siloxane polymer. Specifically, the third temporary bond layer (C) is a cured layer of a thermosetting composition composed mainly of a thermosetting modified siloxane polymer of the general formula (1) or (3).

In one embodiment, the thermosetting modified siloxane polymer is a phenol-containing, organosiloxane bond-containing polymer comprising recurring units of the general formula (1) and having a weight average molecular weight of 3,000 to 500,000.

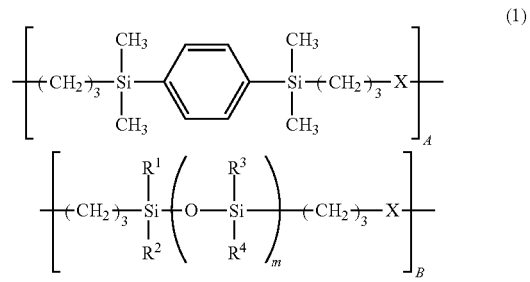

Herein $R^1$ to $R^4$ are each independently a monovalent hydrocarbon group, typically alkyl, of 1 to 8 carbon atoms. The subscript m is an integer of 1 to 100, B is a positive number, and A is 0 or a positive number. X is a divalent organic group having the general formula (2):

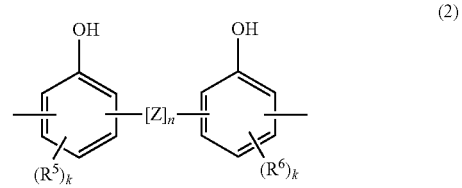

wherein Z is a divalent organic group selected from the following:

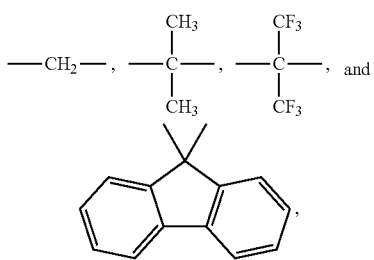

n is 0 or 1, $R^5$ and $R^6$ are each independently an alkyl or alkoxy group of 1 to 4 carbon atoms, and k is 0, 1 or 2.

Suitable groups of $R^1$ to $R^4$ include methyl, ethyl and phenyl. The subscript m is preferably an integer of 3 to 60, more preferably 8 to 40. B and A are preferably such numbers as to give a ratio B/A of 0/1 to 20/1, more preferably 0.5/1 to 5/1.

In another embodiment, the thermosetting modified siloxane polymer is an epoxy-containing silicone polymer comprising recurring units of the general formula (3) and having a weight average molecular weight of 3,000 to 500,000.

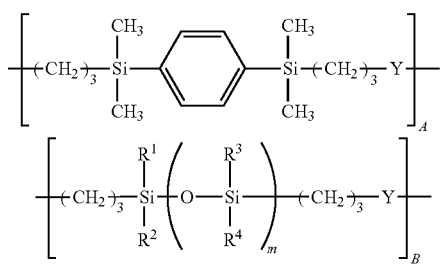

(3)

Herein $R^1$ to $R^4$ are each independently a monovalent hydrocarbon group, typically alkyl, of 1 to 8 carbon atoms, m is an integer of 1 to 100, B is a positive number, A is 0 or a positive number. Y is a divalent organic group having the general formula (4):

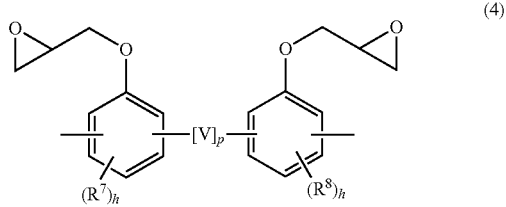

(4)

wherein V is a divalent organic group selected from the following:

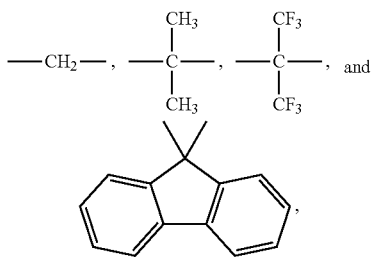

p is 0 or 1, $R^7$ and $R^8$ are each independently an alkyl or alkoxy group of 1 to 4 carbon atoms, and h is 0, 1 or 2.

Exemplary groups of $R^1$ to $R^4$ and suitable values of m are as described above.

The thermosetting composition composed mainly of the thermosetting modified siloxane polymer of formula (1) or (3) defined above contains a crosslinker for the thermosetting purpose. For the phenolic siloxane polymer of formula (1), the crosslinker is at least one member selected from among an amino condensate modified with formaldehyde or formaldehyde-alcohol, a melamine resin, a urea resin, a phenol compound having on average at least two methylol or alkoxymethylol groups per molecule, and an epoxy compound having on average at least two epoxy groups per molecule. For the epoxy-modified siloxane polymer of formula (3), the crosslinker is at least one member selected from among a phenol compound having on average at least two phenol groups per molecule and an epoxy compound having on average at least two epoxy groups per molecule.

Preferred epoxy compounds having at least two epoxy groups for use with the polymers of formulae (1) and (3) as the crosslinker include, but are not limited to, multi-functional epoxy resins having a functionality of 2, 3, 4 or more, for example, those resins commercially available under the trade name of EOCN-1020, EOCN-102S, XD-1000, NC-2000-L, EPPN-201, GAN and NC6000 from Nippon Kayaku Co., Ltd. Crosslinkers of the following formulae are also useful.

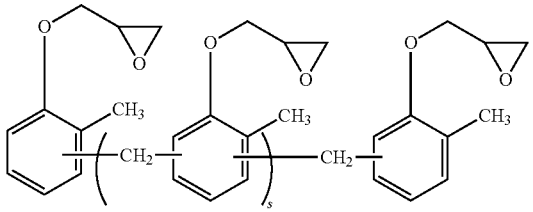

EOCN-1020
s = 3 to 6

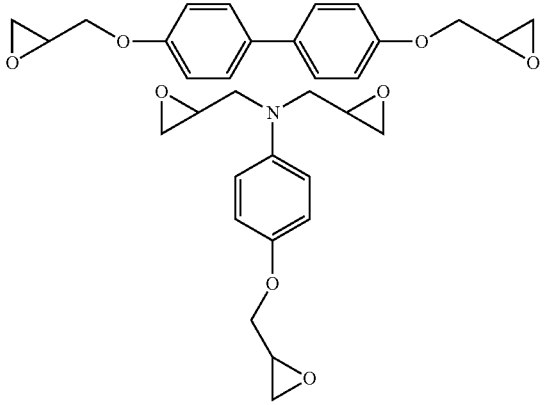

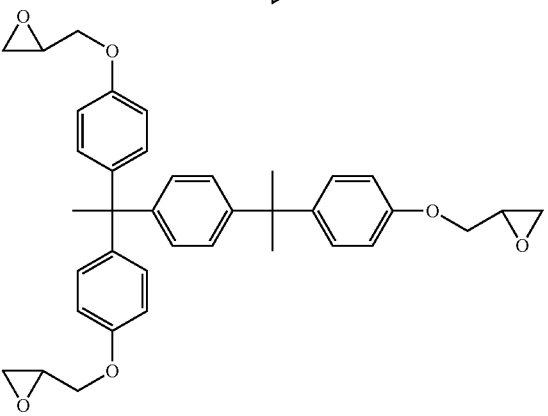

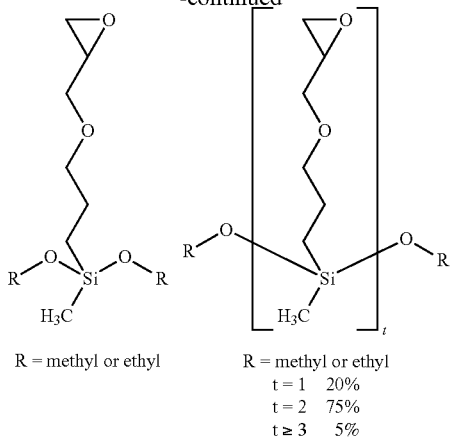

R = methyl or ethyl

R = methyl or ethyl
t = 1  20%
t = 2  75%
t ≥ 3  5%

Suitable crosslinkers for use with the epoxy-modified siloxane polymer of formula (3) include m and p-cresol novolak resins, e.g., EP-6030G from Asahi Organic Chemicals Industry Co., Ltd., trifunctional phenol compounds, e.g., TrisP-PA from Honshu Chemical Industry Co., Ltd., and tetrafunctional phenol compounds, e.g., TEP-TPA from Asahi Organic Chemicals Industry Co., Ltd.

The crosslinker is added in an amount of 0.1 to 50 parts, preferably 0.1 to 30 parts, and more preferably 1 to 20 parts by weight per 100 parts by weight of the modified siloxane polymer. More than one crosslinker may be added in admixture.

To the composition, a curing catalyst such as acid anhydride may be added in an amount of up to 10 parts by weight per 100 parts by weight of the modified siloxane polymer.

The thermosetting resin composition may be dissolved in a solvent to form a solution which is applied to a support by a suitable coating technique such as spin coating, roll coating or die coating. Examples of the solvent used herein include ketones such as cyclohexanone, cyclopentanone, and methyl-2-n-amylketone, alcohols such as 3-methoxybutanol, 3-methyl-3-methoxybutanol, 1-methoxy-2-propanol, and 1-ethoxy-2-propanol, ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether, and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone, which may be used alone or in admixture.

Notably, any well-known antioxidants and fillers such as silica may be added to the composition in an amount of up to 50 parts by weight per 100 parts by weight of the modified siloxane polymer for further enhancing heat resistance or other properties. Also a surfactant may be added for improving coating uniformity.

The third temporary bond layer (C) is preferably deposited such that the cured thickness is in the range of 15 to 150 μm, more preferably 20 to 120 μm, depending on steps on the wafer. If the layer (C) is less than 15 μm, it may not withstand the grinding step for the thinning of a wafer. If the layer (C) is more than 150 μm, it may undergo deformation during the heat treatment step such as TSV forming step, which is practically unacceptable.

Thin Wafer Manufacturing Method

A further embodiment of the invention is a method for manufacturing a thin wafer, which is characterized in that a temporary adhesive layer (or bonding arrangement) consisting of three layers, layers (A), (B) and (C) defined above is used as a bond layer between a wafer (having a semiconductor circuit formed therein) and a support. The thin wafer manufactured by the method typically has a thickness of 5 to 300 μm, more typically 10 to 100 μm.

The method for manufacturing a thin wafer involves releasably bonding a wafer to a support via a temporary bonding arrangement comprising a combination of a thermoplastic siloxane bond-free polymer layer (A), a thermoplastic siloxane polymer layer (B), and a thermosetting modified siloxane polymer layer (C), the wafer having a circuit-forming front surface and a non-circuit-forming back surface, with the circuit-forming surface facing the support. The method comprises the steps of:

(a) forming polymer layer (C) on the support, forming polymer layer (B) on polymer layer (C), removing only a region of polymer layer (B) which corresponds to a peripheral region of the wafer, and forming polymer layer (A) on the wafer, (b) laminating together the support having polymer layers (C) and (B) formed thereon and the wafer having polymer layer (A) formed thereon in vacuum, (c) heat curing polymer layer (C), (d) grinding the non-circuit-forming surface of the wafer bonded to the support, (e) processing the non-circuit-forming surface of the wafer, (f) releasing the processed wafer from the support, and (g) optionally removing any bond layer from the circuit-forming surface of the wafer.

[Steps (a)-(b)-(c)]

A wafer having a circuit-forming front surface and a non-circuit-forming back surface is provided. In step (a), the circuit-forming surface of the wafer is bonded to a support via a temporary bonding arrangement consisting of three layers, layers (A), (B) and (C) defined above, yielding a wafer processing laminate. The wafer has a pair of opposed surfaces, that is, a front surface where a semiconductor circuit is formed and a back surface where a semiconductor circuit is not formed. The wafer which can be used herein is typically a semiconductor wafer. Suitable semiconductor wafers include silicon wafers, germanium wafers, gallium-arsenic wafers, gallium-phosphorus wafers, and gallium-arsenic-aluminum wafers. Although the thickness of the wafer is not particularly limited, it is typically 600 to 800 μm, more typically 625 to 775 μm.

The support which can be used herein may be selected from substrates such as silicon wafers, glass substrates, and quartz wafers. In the practice of the invention, the support need not be light transmissive because there is no need to irradiate energy radiation to the temporary adhesive layer through the support.

The temporary bond layers (A), (B) and (C) may be preformed as films, which may be attached to the wafer or the support. Alternatively, their solutions may be applied to the wafer or the support by a suitable coating technique such as spin coating. After coating, prebake is performed at a temperature of 80 to 200° C., depending on the volatility of a particular solvent used. The resulting laminate is ready for use.

Prior to use, the outer peripheral region of layer (B) has been removed by a simple method, typically EBR method, as mentioned above.

The wafer and support having layers (A), (B) and (C) formed thereon are joined together via layers (A), (B) and (C) into an assembly. The assembly is uniformly compressed preferably at a temperature of 40 to 200° C., more preferably 60 to 180° C. in a vacuum atmosphere to complete a wafer processing laminate. The wafer bonding system used herein includes commercially available wafer bonders such as EVG520IS and 850TB from EV Group, and XBC300 from SUSS MicroTec AG.

[Step (d)]

Following is step (d) of grinding the non-circuit-forming surface of the wafer bonded to the support. Step (d) is intended to reduce the thickness of the wafer by grinding the wafer back surface of the wafer processing laminate resulting from step (a). As used herein, the term "grinding" refers to grinding, polishing and otherwise machining a workpiece. The technique of grinding the wafer back surface is not particularly limited, and any well-known grinding techniques may be used. The wafer is ground by a grinding wheel (e.g., diamond grinding wheel), while preferably feeding water to the wafer and the wheel for cooling. As the means for grinding the wafer back surface, for example, a surface grinder DAG-810 by DISCO Co., Ltd. may be used.

[Step (e)]

Step (e) is for processing the non-circuit-forming surface of the wafer processing laminate which has been ground, i.e., the non-circuit-forming surface of the wafer which has been thinned by back surface grinding (d). This step includes various processes which can be applied on the wafer level, for example, electrode formation, metal conductor formation, and protective film formation. More specifically, any conventional well-known processes may be applied, including metal sputtering for forming electrodes or the like, wet etching of a sputtered metal layer, formation of a pattern (serving as a mask for metal conductor formation) by resist coating, exposure and development, removal of resist, dry etching, metallization, silicon etching for TSV formation, oxide film formation on silicon surface.

[Step (f)]

Step (f) is for releasing the wafer which has been processed in step (e) from the wafer processing laminate, that is, separating the thin wafer from the wafer processing laminate after processing in step (e) and before dicing. This release procedure is typically performed at a relatively low temperature from room temperature to about 60° C. Suitable release procedures for separating the wafer from the support include, but are not limited to, a pull-up procedure of holding the wafer or support of the wafer processing laminate horizontally, and pulling up the support or wafer at an angle relative to the horizon, and a peeling procedure of adhering a protective film to the ground surface of the wafer and peeling the protective film together with the wafer from the wafer processing laminate.

Upon release by the peeling procedure, the wafer outer peripheral region may be washed with a solvent, for example, isononane or p-menthane, thereby partially dissolving away the layer (A) exposed at the wafer periphery. This facilitates to release the wafer from the support.

In the method comprising the steps of bonding the circuit-forming front surface of the wafer to the support via a temporary bonding arrangement consisting of bond layers (A), (B) and (C) to construct a laminate, processing the wafer, and releasing the processed wafer from the support, the step (f) of releasing the processed wafer from the support preferably includes (f-1) attaching a dicing tape to the processed surface of the wafer, (f-2) vacuum chucking the dicing tape-attached surface to a chuck surface, (f-3) releasing the support from the processed wafer by peel-off while keeping the chuck surface at a temperature in the range of 10 to 100° C., and (f-4) removing any bond layer from the circuit-forming surface of the wafer.

[Step (g)]

If the temporary bond layer (A) is partially left on the circuit-forming surface of the wafer after release step (f), step (g) is taken for removing the temporary bond layer (A) from the circuit-forming surface of the wafer. Sometimes the temporary bond layer (A) is partially left on the circuit-forming surface of the wafer which has been released from the support in step (d) and in this event, the layer (A) must be removed. Removal of layer (A) may be performed by washing the wafer, for example.

Step (g) may use any cleaning fluid which is capable of dissolving the thermoplastic organopolysiloxane-free polymer of which layer (A) is made. Suitable solvents include pentane, hexane, cyclohexane, decane, isononane, p-menthane, pinene, isododecane, and limonene, which may be used alone or in admixture. If removal is difficult, a base or acid may be added to the solvent. Suitable bases include amines such as ethanolamine, diethanolamine, triethanolamine, triethylamine, and ammonia, and ammonium salts such as tetramethylammonium hydroxide. Suitable acids include organic acids such as acetic acid, oxalic acid, benzenesulfonic acid, and dodecylbenzenesulfonic acid. The base or acid is typically added in such amounts as to give a concentration of 0.01 to 10%, preferably 0.1 to 5% by weight in the cleaning fluid. For more efficient removal of residues, any known surfactants may be added to the cleaning fluid. The washing step may be carried out by agitating the fluid with a puddle, spraying the fluid or immersing in a cleaning fluid bath. The temperature is preferably 10 to 80° C., more preferably 15 to 65° C. The dissolution of layer (A) in the cleaning fluid may be followed by water or alcohol rinsing and drying, yielding a thin wafer.

EXAMPLE

Examples of the invention are given below by way of illustration and not by way of limitation. Mw is weight average molecular weight as measured by gel permeation chromatography (GPC) versus polystyrene standards.

Resin Synthesis Example 1

A four-necked flask was charged with 1,000 g (3.38 mol) of octamethylcyclotetrasiloxane and 0.24 g (0.0015 mol) of hexamethyldisiloxane and heated at a temperature of 110° C. Then, 4 g of 10 wt % tetrabutylphosphonium hydroxide siliconate was added to the flask whereupon polymerization was performed over 4 hours. The product was post-treated at 160° C. for 2 hours, obtaining dimethylpolysiloxane.

The product was analyzed by $^{29}$Si-NMR spectroscopy to determine the contents of D and M units. It was identified to be a dimethylpolysiloxane of the following structure consisting of 99.978% of D units and 0.022% of M units and having a degree of polymerization of about 9,000.

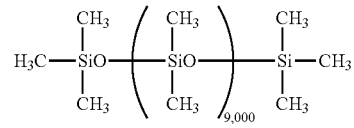

This dimethylpolysiloxane, 500 g, was dissolved in 500 g of hexane. This was poured into 2 L of acetone whereupon a precipitated resin was recovered. On subsequent removal of hexane in vacuum, there was obtained a dimethylpolysiloxane polymer having a Mw of 700,000 and containing 0.05 wt % of a low molecular fraction having a molecular weight of up to 740. This polymer, 20 g, was dissolved in 80 g of p-menthane and filtered through a membrane filter with a pore size of 0.2 μm, obtaining a p-menthane solution (B-1) of dimethylpolysiloxane.

Resin Synthesis Example 2

A four-necked flask was charged with 1,000 g (3.38 mol) of octamethylcyclotetrasiloxane and 0.93 g (0.003 mol) of tris(trimethylsiloxy)methylsilane and heated at a temperature of 110° C. Then, 4 g of 10 wt % tetrabutylphosphonium hydroxide siliconate was added to the flask whereupon polymerization was performed over 4 hours. The product was post-treated at 160° C. for 2 hours, obtaining dimethylpolysiloxane.

The product was analyzed by $^{29}$Si-NMR spectroscopy to determine the contents of D, M and T units. It was identified to be a branched dimethylpolysiloxane of the following structure consisting of 99.911% of D units, 0.067% of M units, and 0.022% of T units.

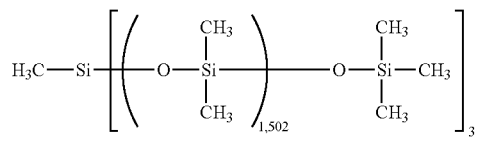

This branched dimethylpolysiloxane, 500 g, was dissolved in 500 g of hexane. This was poured into 2 L of acetone whereupon a precipitated resin was recovered. On subsequent removal of hexane in vacuum, there was obtained a dimethylpolysiloxane polymer having a Mw of 400,000 and containing 0.07 wt % of a low molecular fraction having a molecular weight of up to 740. This polymer, 20 g, was dissolved in 80 g of isononane and filtered through a membrane filter with a pore size of 0.2 μm, obtaining an isononane solution (B-2) of dimethylpolysiloxane.

Resin Synthesis Example 3

A flask equipped with a stirrer, thermometer, nitrogen purge line and reflux condenser was charged with 43.1 g of 9,9'-bis(3-allyl-4-hydroxyphenyl)fluorene (M-1), 29.5 g of organohydrogensiloxane having the average structural formula (M-3), 135 g of toluene, and 0.04 g of chloroplatinic acid and heated at 80° C. Then, 17.5 g of 1,4-bis(dimethylsilyl)benzene (M-5) was added dropwise to the flask over one hour while the flask internal temperature rose to 85° C. At the end of dropwise addition, the reaction solution was aged at 80° C. for 2 hours. Toluene was distilled off, and instead, 80 g of cyclohexanone was added, obtaining a resin solution in cyclohexanone having a resin solid concentration of 50 wt %. The molecular weight of the resin in the solution was determined by GPC versus polystyrene standards, finding a Mw of 45,000. To 50 g of the resin solution were added 7.5 g of an epoxy compound (EOCN-1020 by Nippon Kayaku Co., Ltd.) as crosslinker, 0.2 g of bis(t-butylsulfonyl)diazomethane (BSDM) by Wako Pure Chemical Industries, Ltd.) as cure catalyst, and 0.1 g of an antioxidant (AO-60 by Adeka Co., Ltd.). Filtration through a membrane filter with a pore size of 0.2 μm yielded a resin solution (C-1).

Resin Synthesis Example 4

In a 5-L flask equipped with a stirrer, thermometer, nitrogen purge line and reflux condenser, 84.1 g of epoxy compound (M-2) was dissolved in 600 g of toluene. Then 294.6 g of compound (M-3) and 25.5 g of compound (M-4) were added to the flask, which was heated at 60° C. Then 1 g of platinum catalyst on carbon (5 wt %) was added. It was seen that the internal temperature rose to 65-67° C. Thereafter, the flask was further heated at 90° C., held at the temperature for 3 hours, and cooled to room temperature. To the reaction solution was added 600 g of methyl isobutyl ketone (MIBK). The reaction solution was passed through a filter under pressure to remove the platinum catalyst. Once the solvent was distilled off in vacuum from the polymer solution, propylene glycol monomethyl ether acetate (PGMEA) was added to the residue to form a resin solution in PGMEA having a solid concentration of 60 wt %. The molecular weight of the resin in the solution was determined by GPC versus polystyrene standards, finding a Mw of 28,000. To 100 g of the resin solution were added 9 g of tetrafunctional phenol compound (TEP-TPA by Asahi Organic Chemical Industry Co., Ltd.) and 0.2 g of tetrahydrophthalic anhydride (Rikacid HH-A by New Japan Chemical Co., Ltd.). Filtration through a membrane filter with a pore size of 0.2 μm yielded a resin solution (C-2).

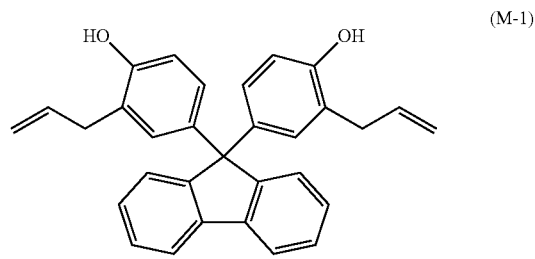

(M-1)

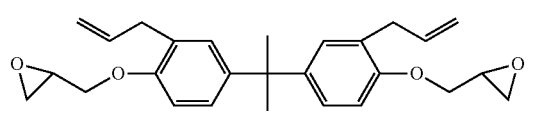

(M-2)

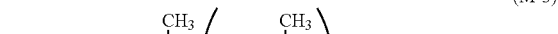

(M-3)

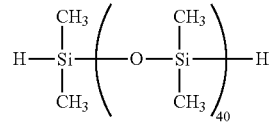

(M-4)

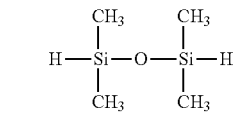

(M-5)

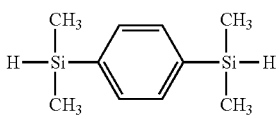

Resin Film Preparation Example 1

Thermoplastic hydrogenated polystyrene based elastomer Septon® 4033 (polystyrene-poly(ethylene-ethylene/propylene)-polystyrene block copolymer by Kuraray Co., Ltd.), 20 g, was dissolved in 180 g of isononane to form a 10 wt % isononane solution of Septon® 4033. The solution was filtered through a membrane filter having a pore size of 0.2 μm, yielding an isononane solution (A-1) of thermoplastic organopolysiloxane-free polymer.

Examples 1 to 5 and Comparative Examples 1 to 3

The wafer used herein was a silicon wafer (diameter 200 mm, thickness 725 μm) having copper posts (diameter 40 μm, height 10 μm) distributed over its entire surface. Polymer solution (A-1) was spin coated and heated on a hot plate at 150° C. for 5 minutes to form a layer (A) having a thickness shown in Table 1 on the bump-formed surface of the wafer.

The support used herein was a glass plate (diameter 200 mm, thickness 500 μm). First the polymer solution (C-1) or (C-2) was spin coated and heated on a hot plate at 150° C. to form a layer (C) having a thickness shown in Table 1 on the glass support. Thereafter, the thermoplastic organosiloxane polymer solution (B-1) or (B-2) was spin coated to form a layer (B) having a thickness shown in Table 1 on the layer (C) on the glass support. Notably the spin coater was equipped with an edge bead rinsing nozzle. In the spin coating step to form layer (B), a region of once formed layer (B) was removed by injecting isononane from the nozzle to a selected position (Table 1) spaced apart from the outermost periphery of the wafer for 30 seconds, and heating on a hot plate at 150° C. for 3 minutes. Since layer (C) lying below layer (B) was not soluble in isononane, a peripheral structure was obtained that layer (B) was removed and layer (C) was exposed only in the wafer outer peripheral region.

Using a vacuum wafer bonder, the silicon wafer having a resin layer (A) was joined to the glass plate having resin layers (C) and (B), with their resin layers mated together, under the pressure bonding condition shown in Table 1. A laminate was obtained in this way. It is noted that although a glass plate is used herein as the support so that the laminate may be visually inspected for defects, a wafer or substrate which is not transmissive to light may be used.

The laminate was examined by the following tests. The results of Examples are shown in Table 1, and the results of Comparative Examples are shown in Table 2. The tests were carried out in the following order. If a sample failed in a certain test (judged "x"), the subsequent test was no longer performed.

Adhesion Test

Using a wafer bonder EVG520IS of EV Group, a wafer with a diameter of 200 mm was bonded to a support under conditions including a bonding temperature as shown in Table 1, a chamber internal pressure of less than $10^{-3}$ mbar, and a load of 5 kN. After bonding, the laminate was heated in an oven at 180° C. for 1 hour for curing layer (C). After cooling to room temperature, the interfacial bond state was visually observed. The sample was evaluated good (○) when no defectives like bubbles were found at the interface, and poor (x) when defectives were found.

Back Surface Grinding Test

The back surface of a silicon wafer was ground by a grinder DAG810 of DISCO Co., Ltd. having a diamond abrasive wheel. After the wafer was ground to a final thickness of 50 μm, it was observed for defectives such as cracks and dislodgment under an optical microscope (100×). The sample was evaluated good (○) when no defectives were found, and poor (x) when defectives were found.

Heat Resistance Test

After the silicon wafer had been ground, the laminate was placed in a nitrogen atmosphere oven at 200° C. for 2 hours and then heated on a hot plate at 260° C. for 10 minutes. The outer appearance of the laminate was observed for anomaly. The sample was evaluated good (○) when no appearance anomalies were found, fair (Δ) when slight warp of wafer was found, but no anomalies (void formation, wafer bulging or wafer rupture), and poor (x) when appearance anomalies (void formation, wafer bulging or wafer rupture) were found.

Peel Test

The wafer release ability was evaluated. Following the heat resistance test, the wafer was set in the spin coater. While the wafer was spun at 1,000 rpm for 60 seconds, isononane was injected from the edge bead rinsing nozzle to the wafer edge for 60 seconds. Thereafter, the wafer was spun at 1,000 rpm for 10 seconds until the wafer edge was dried. A dicing tape was then applied to the surface of the wafer which had been thinned to 50 μm, using a dicing frame. The dicing tape was set to the chuck platen by vacuum chucking. At room temperature, the glass plate was peeled by pulling it up at one point using a pair of tweezers. The sample was evaluated good (○) when the glass was peeled without breakage of the 50-μm wafer, fair (Δ) when edge bead rinsing of isononane for 60 seconds was short, but additional edge bead rinsing of isononane for 120 seconds enabled peeling, and poor (x) when fissure or other anomalies occurred.

Clean-Up Test

After the peel test, the 200-mm wafer mounted on the dicing frame via the dicing tape (which had been exposed to the heat resistance test conditions) was set on a spin coater, with the adhesive layer upside. Isononane as cleaning fluid was sprayed for 3 minutes. Rinsing was performed by spraying isopropyl alcohol (IPA) while spinning the wafer. The outer appearance of the wafer was visually observed for any residual adhesive resin. The sample was evaluated good (○) in the absence of residual resin and poor (x) in the presence of residual resin.

TABLE 1

| | Example | | | | |
| --- | --- | --- | --- | --- | --- |
| | 1 | 2 | 3 | 4 | 5 |
| Resin layer (A) | A-1 | A-1 | A-1 | A-1 | A-1 |
| Layer (A) thickness | 5 μm | 7 μm | 3 μm | 5 μm | 2 μm |
| Resin layer (B) | B-1 | B-2 | B-1 | B-1 | B-1 |
| Layer (B) thickness | 0.5 μm | 1 μm | 2 μm | 1 μm | 15 μm |
| Removal of layer (B) at a position from wafer periphery | 0.5 mm | 2 mm | 7 mm | 12 mm | 2 mm |
| Resin layer (C) | C-1 | C-1 | C-2 | C-1 | C-2 |
| Layer (C) thickness | 30 μm | 50 μm | 70 μm | 50 μm | 50 μm |
| Bonding temperature | 150° C. | 150° C. | 120° C. | 150° C. | 120° C. |
| Adhesion | ○ | ○ | ○ | ○ | ○ |

TABLE 1-continued

| | Example | | | | |
|---|---|---|---|---|---|
| | 1 | 2 | 3 | 4 | 5 |
| Resistance to back surface grinding | ○ | ○ | ○ | ○ | ○ |
| Heat resistance | ○ | ○ | ○ | ○ | Δ |
| Peel test | ○ | ○ | ○ | Δ | ○ |
| Clean-up test | ○ | ○ | ○ | ○ | ○ |

TABLE 2

| | Comparative Example | | |
|---|---|---|---|
| | 1 | 2 | 3 |
| Resin layer (A) | A-1 | B-2 | A-1 |
| Layer (A) thickness | 5 μm | 3 μm | 3 μm |
| Resin layer (B) | B-1 | B-1 | not formed |
| Layer (B) thickness | 0.5 μm | 2 μm | — |
| Removal of layer (B) at a position from wafer periphery | not removed | 2 mm | — |
| Resin layer (C) | C-1 | C-1 | C-1 |
| Layer (C) thickness | 50 μm | 50 μm | 50 μm |
| Bonding temperature | 150° C. | 150° C. | 150° C. |
| Adhesion | ○ | ○ | ○ |
| Resistance to back surface grinding | ○ | ○ | ○ |
| Heat resistance | X | X | ○ |
| Peel test | — | — | X |
| Clean-up test | — | — | — |

Japanese Patent Application No. 2012-098734 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A wafer processing laminate comprising a support, a temporary adhesive layer on the support, and a wafer laid contiguous to the temporary adhesive layer, the wafer having a circuit-forming front surface and a back surface to be processed, said temporary adhesive layer being a composite temporary adhesive layer having a trilayer structure consisting of a first temporary bond layer (A) of thermoplastic siloxane bond-free polymer which is releasably bonded to the front surface of the wafer, a second temporary bond layer (B) of thermoplastic siloxane polymer which is laid contiguous to a central region of the first temporary bond layer excluding a peripheral region, and a third temporary bond layer (C) of thermosetting modified siloxane polymer which is laid contiguous to the support, wherein in the peripheral region where the second temporary bond layer (B) is removed, a peripheral portion of the first temporary bond layer (A) is in close contact with a peripheral portion of the third temporary bond layer (C).

2. The wafer processing laminate of claim 1 wherein a ratio of the removal of the peripheral region of the secondary temporary bond layer (B) to the radius of the wafer is 0.1 to 20%.

3. The wafer processing laminate of claim 1 wherein the peripheral region where the second temporary bond layer (B) is removed is a region extending between the outermost periphery of the wafer and a position spaced apart 0.5 to 10 mm radially inward from the outermost periphery of the wafer.

4. The wafer processing laminate of claim 1 wherein the second temporary bond layer (B) of thermoplastic siloxane polymer has a thickness of 0.1 to 10 μm, and the third temporary bond layer (C) of thermosetting modified siloxane polymer has a thickness of 15 to 150 μm.

5. The wafer processing laminate of claim 1 wherein the first temporary bond layer (A) of thermoplastic siloxane bond-free polymer comprises a thermoplastic elastomer.

6. The wafer processing laminate of claim 5 wherein the thermoplastic elastomer is a hydrogenated polystyrene base elastomer.

7. The wafer processing laminate of claim 1 wherein the second temporary bond layer (B) comprise a non-reactive organopolysiloxane consisting of 99.000 to 99.999 mol % of difunctional siloxane units of $R^{11}R^{12}SiO_{2/2}$, 1.000 to 0.001 mol % of monofunctional siloxane units of $R^{13}R^{14}R^{15}SiO_{1/2}$, and 0.000 to 0.500 mol % of trifunctional siloxane units of $R^{16}SiO_{3/2}$, wherein $R^{11}$, $R^{12}$, $R^{13}$, $R^{14}$, $R^{15}$, and $R^{16}$ are each independently a substituted or unsubstituted monovalent hydrocarbon group, having a weight average molecular weight of 200,000 to 1,000,000, and containing up to 0.5% by weight of a low molecular fraction having a molecular weight of up to 740.

8. The wafer processing laminate of claim 1 wherein the third temporary bond layer (C) of thermosetting modified siloxane polymer is a cured layer of a thermosetting resin composition comprising a siloxane bond-containing polymer and a crosslinker.

9. The wafer processing laminate of claim 8 wherein the thermosetting resin composition comprises 100 parts by weight of a siloxane bond-containing polymer comprising recurring units of the general formula (1) and having a weight average molecular weight of 3,000 to 500,000, and 0.1 to 50 parts by weight of a crosslinker which is selected from the group consisting of an amino condensate modified with formaldehyde or formaldehyde-alcohol, a melamine resin, a urea resin, a phenol compound having on average at least two methylol or alkoxymethylol groups per molecule, and an epoxy compound having on average at least two epoxy groups per molecule,

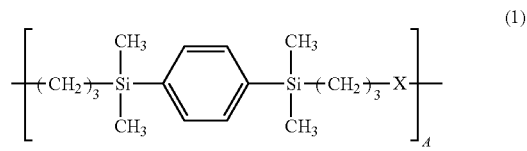

(1)

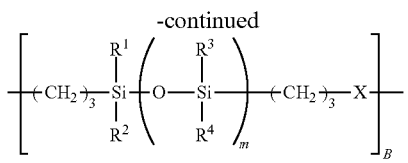

wherein $R^1$ to $R^4$ are each independently a monovalent hydrocarbon group of 1 to 8 carbon atoms, m is an integer of 1 to 100, B is a positive number, A is 0 or a positive number, and X is a divalent organic group having the general formula (2):

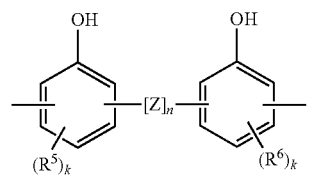

wherein Z is a divalent organic group selected from the following:

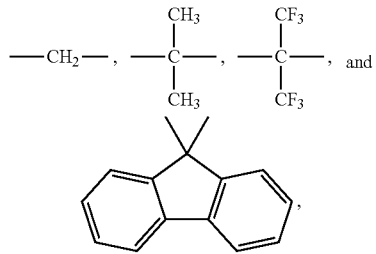

n is 0 or 1, $R^5$ and $R^6$ are each independently an alkyl or alkoxy group of 1 to 4 carbon atoms, and k is 0, 1 or 2.

10. The wafer processing laminate of claim 8 wherein the thermosetting resin composition comprises 100 parts by weight of a siloxane bond-containing polymer comprising recurring units of the general formula (3) and having a weight average molecular weight of 3,000 to 500,000, and 0.1 to 50 parts by weight of a crosslinker which is selected from the group consisting of a phenol compound having on average at least two phenol groups per molecule and an epoxy compound having on average at least two epoxy groups per molecule,

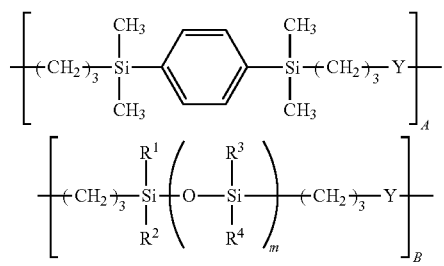

wherein $R^1$ to $R^4$ are each independently a monovalent hydrocarbon group of 1 to 8 carbon atoms, m is an integer of 1 to 100, B is a positive number, A is 0 or a positive number, and Y is a divalent organic group having the general formula (4):

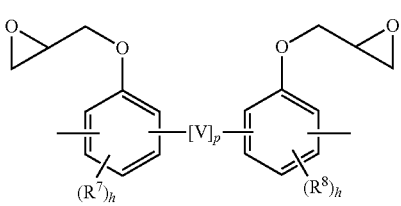

wherein V is a divalent organic group selected from the following:

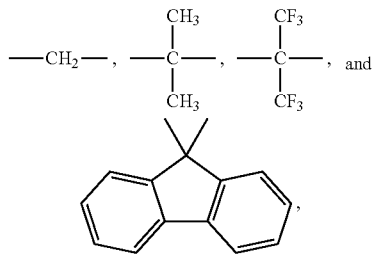

p is 0 or 1, $R^7$ and $R^8$ are each independently an alkyl or alkoxy group of 1 to 4 carbon atoms, and h is 0, 1 or 2.

11. A wafer processing member comprising a support and a temporary adhesive layer on the support, wherein a wafer having a circuit-forming front surface and a back surface to be processed will be temporarily bonded to the temporary adhesive layer,
said temporary adhesive layer being a composite temporary adhesive layer having a trilayer structure consisting of a first temporary bond layer (A) of thermoplastic siloxane bond-free polymer which can be releasably bonded to the front surface of the wafer, a second temporary bond layer (B) of thermoplastic siloxane polymer which is laid contiguous to a central region of the first temporary bond layer excluding a peripheral region, and a third temporary bond layer (C) of thermosetting modified siloxane polymer which is laid contiguous to the support, wherein in the peripheral region where the second temporary bond layer (B) is removed, a peripheral portion of the first temporary bond layer (A) is in close contact with a peripheral portion of the third temporary bond layer (C).

12. The wafer processing member of claim 11 wherein the first temporary bond layer (A) of thermoplastic siloxane bond-free polymer comprises a polymer layer of a thermoplastic elastomer, the thermoplastic elastomer being a hydrogenated polystyrene base elastomer.

13. The wafer processing member of claim 11 wherein the second temporary bond layer (B) comprise a non-reactive organopolysiloxane consisting of 99.000 to 99.999 mol % of difunctional siloxane units of $R^{11}R^{12}SiO_{2/2}$, 1.000 to 0.001 mol % of monofunctional siloxane units of $R^{13}R^{14}R^{15}SiO_{1/2}$, and 0.000 to 0.500 mol % of trifunctional siloxane units of $R^{16}SiO_{3/2}$, wherein $R^{11}$, $R^{12}$, $R^{13}$, $R^{14}$, $R^{15}$, and $R^{16}$ are each independently a substituted or unsubstituted monovalent hydrocarbon group, having a weight average molecular weight of 200,000 to 1,000,000, and containing up to 0.5% by weight of a low molecular fraction having a molecular weight of up to 740.

14. The wafer processing member of claim 11 wherein the third temporary bond layer (C) of thermosetting modified siloxane polymer is a cured layer of a composition comprising 100 parts by weight of a siloxane bond-containing polymer comprising recurring units of the general formula (1) and having a weight average molecular weight of 3,000 to 500,000, and 0.1 to 50 parts by weight of a crosslinker which is selected from the group consisting of an amino condensate modified with formaldehyde or formaldehyde-alcohol, a melamine resin, a urea resin, a phenol compound having on average at least two methylol or alkoxymethylol groups per molecule and an epoxy compound having on average at least two epoxy groups per molecule,

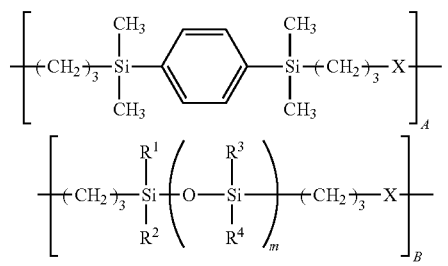

wherein $R^1$ to $R^4$ are each independently a monovalent hydrocarbon group of 1 to 8 carbon atoms, m is an integer of 1 to 100, B is a positive number, A is 0 or a positive number, and X is a divalent organic group having the general formula (2):

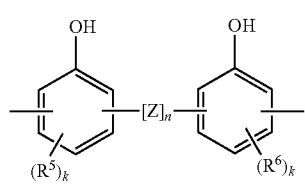

wherein Z is a divalent organic group selected from the following:

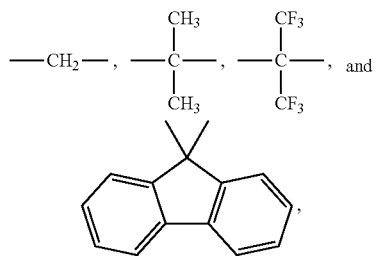

n is 0 or 1, $R^5$ and $R^6$ are each independently an alkyl or alkoxy group of 1 to 4 carbon atoms, and k is 0, 1 or 2.

15. The wafer processing member of claim 11 wherein the third temporary bond layer (C) of thermosetting modified siloxane polymer is a cured layer of a composition comprising 100 parts by weight of a siloxane bond-containing polymer comprising recurring units of the general formula (3) and having a weight average molecular weight of 3,000 to 500,000, and 0.1 to 50 parts by weight of a crosslinker which is selected from the group consisting of a phenol compound having on average at least two phenol groups per molecule and an epoxy compound having on average at least two epoxy groups per molecule,

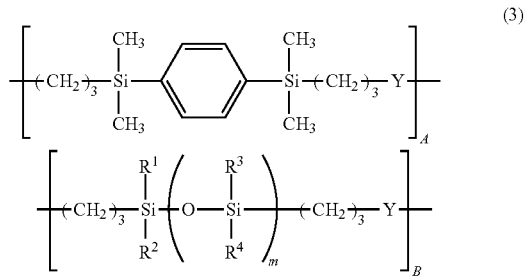

wherein $R^1$ to $R^4$ are each independently a monovalent hydrocarbon group of 1 to 8 carbon atoms, m is an integer of 1 to 100, B is a positive number, A is 0 or a positive number, and Y is a divalent organic group having the general formula (4):

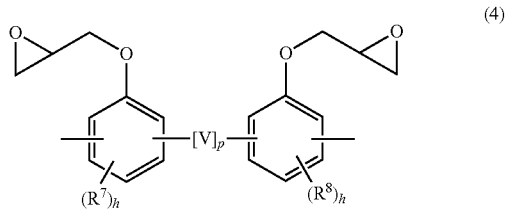

wherein V is a divalent organic group selected from the following:

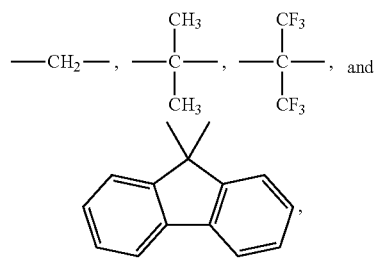

p is 0 or 1, $R^7$ and $R^8$ are each independently an alkyl or alkoxy group of 1 to 4 carbon atoms, and h is 0, 1 or 2.

16. An arrangement for temporarily bonding a wafer to a support for wafer processing, the wafer having a circuit-forming front surface and a back surface to be processed, said temporary bonding arrangement being a composite temporary adhesive layer having a trilayer structure consisting of a first temporary bond layer (A) of thermoplastic siloxane bond-free polymer which can be releasably bonded to the front surface of the wafer, a second temporary bond layer (B) of thermoplastic siloxane polymer which is laid contiguous to a central region of the first temporary bond layer excluding a peripheral region, and a third temporary bond layer (C) of thermosetting modified siloxane polymer which can be laid contiguous to the support, wherein in the peripheral region where the second temporary bond layer (B) is removed, a peripheral portion of the first temporary bond layer (A) is in close contact with a peripheral portion of the third temporary bond layer (C).

17. The temporary bonding arrangement of claim 16 wherein the first temporary bond layer (A) of thermoplastic siloxane bond-free polymer comprises a thermoplastic hydrogenated polystyrene base elastomer.

18. The temporary bonding arrangement of claim 16 wherein the second temporary bond layer (B) comprises a non-reactive organopolysiloxane consisting of 99.000 to 99.999 mol % of difunctional siloxane units of $R^{11}R^{12}SiO_{2/2}$, 1.000 to 0.001 mol % of monofunctional siloxane units of $R^{13}R^{14}R^{15}SiO_{1/2}$, and 0.000 to 0.500 mol % of trifunctional siloxane units of $R^{16}SiO_{3/2}$, wherein $R^{11}$, $R^{12}$, $R^{13}$, $R^{14}$, $R^{15}$, and $R^{16}$ are each independently a substituted or unsubstituted monovalent hydrocarbon group, having a weight average molecular weight of 200,000 to 1,000,000, and containing up to 0.5% by weight of a low molecular fraction having a molecular weight of up to 740.

19. The temporary bonding arrangement of claim 16 wherein the third temporary bond layer (C) of thermosetting modified siloxane polymer is a cured layer of a composition comprising 100 parts by weight of a siloxane bond-containing polymer comprising recurring units of the general formula (1) and having a weight average molecular weight of 3,000 to 500,000, and 0.1 to 50 parts by weight of a crosslinker which is selected from the group consisting of an amino condensate modified with formaldehyde or formaldehyde-alcohol, a melamine resin, a urea resin, a phenol compound having on average at least two methylol or alkoxymethylol groups per molecule, and an epoxy compound having on average at least two epoxy groups per molecule,

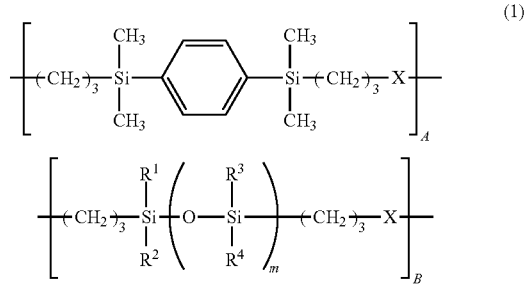

wherein $R^1$ to $R^4$ are each independently a monovalent hydrocarbon group of 1 to 8 carbon atoms, m is an integer of 1 to 100, B is a positive number, A is 0 or a positive number, and X is a divalent organic group having the general formula (2):

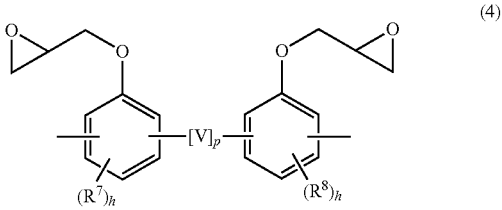

wherein Z is a divalent organic group selected from the following:

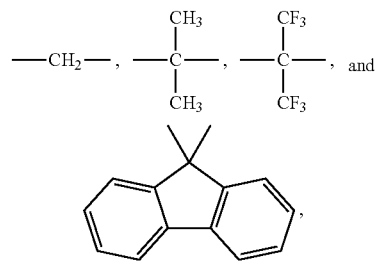

n is 0 or 1, $R^5$ and $R^6$ are each independently an alkyl or alkoxy group of 1 to 4 carbon atoms, and k is 0, 1 or 2.

20. The temporary bonding arrangement of claim 19 wherein the third temporary bond layer (C) of thermosetting modified siloxane polymer is a cured layer of a composition comprising 100 parts by weight of a siloxane bond-containing polymer comprising recurring units of the general formula (3) and having a weight average molecular weight of 3,000 to 500,000, and 0.1 to 50 parts by weight of a crosslinker which is selected from the group consisting of a phenol compound having on average at least two phenol groups per molecule and an epoxy compound having on average at least two epoxy groups per molecule,

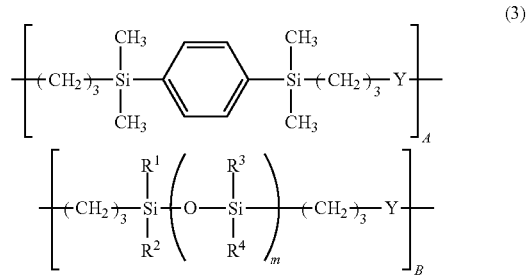

wherein $R^1$ to $R^4$ are each independently a monovalent hydrocarbon group of 1 to 8 carbon atoms, m is an integer of 1 to 100, B is a positive number, A is 0 or a positive number, and Y is a divalent organic group having the general formula (4):

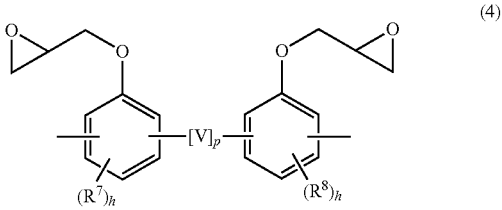

wherein V is a divalent organic group selected from the following:

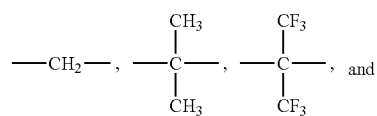

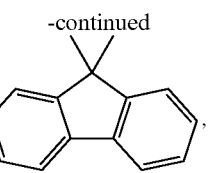

p is 0 or 1, $R^7$ and $R^8$ are each independently an alkyl or alkoxy group of 1 to 4 carbon atoms, and h is 0, 1 or 2.

21. A method for manufacturing a wafer processing laminate, the wafer processing laminate comprising a support, a temporary adhesive layer on the support, and a wafer laid contiguous to the temporary adhesive layer, the wafer having a circuit-forming front surface and a back surface to be processed, said method comprising the steps of:
preparing a wafer component by forming a first temporary bond layer (A) of thermoplastic siloxane bond-free polymer on a wafer, the wafer component having the first temporary bond layer (A) being releasably bonded to the front surface of the wafer, preparing a support component by forming a third temporary bond layer (C) of thermosetting modified siloxane polymer on a support, forming a second temporary bond layer (B) of thermoplastic siloxane polymer on the third temporary bond layer (C), and removing a portion of the second temporary bond layer (B) which corresponds to a peripheral region of the wafer, using a solvent, and laminating together the wafer component and the support component.

22. A method for manufacturing a thin wafer by releasably bonding a wafer to a support via a bonding arrangement comprising a combination of a thermoplastic siloxane bond-free polymer layer (A), a thermoplastic siloxane polymer layer (B), and a thermosetting modified siloxane polymer layer (C), the wafer having a circuit-forming front surface and a non-circuit-forming back surface, with the circuit-forming surface facing the support, said method comprising the steps of:

(a) forming polymer layer (C) on the support, forming polymer layer (B) on polymer layer (C), removing only a region of polymer layer (B) which corresponds to a peripheral region of the wafer, and forming polymer layer (A) on the wafer, (b) laminating together the support having polymer layers (C) and (B) formed thereon and the wafer having polymer layer (A) formed thereon in vacuum, (c) heat curing polymer layer (C), (d) grinding the non-circuit-forming surface of the wafer bonded to the support, (e) processing the non-circuit-forming surface of the wafer, (f) releasing the processed wafer from the support, and (g) optionally removing any bond layer from the circuit-forming surface of the wafer.

23. A method for manufacturing a thin wafer, comprising the steps of releasably bonding a wafer to a support via a bonding arrangement to form a laminate, the bonding arrangement comprising a combination of a thermoplastic siloxane bond-free polymer layer (A), a thermoplastic siloxane polymer layer (B), and a thermosetting modified siloxane polymer layer (C), the wafer having a circuit-forming front surface and a non-circuit-forming back surface, with the circuit-forming surface facing the support, processing the wafer, and releasing the processed wafer from the support, the step (f) of releasing the processed wafer from the support including (f-1) attaching a dicing tape to the processed surface of the wafer, (f-2) vacuum chucking the dicing tape-attached surface to a chuck surface, (f-3) releasing the support from the processed wafer by peel-off while keeping the chuck surface at a temperature in the range of 10 to 100° C., and (f-4) removing any bond layer from the circuit-forming surface of the wafer.

* * * * *